(12) United States Patent
Suda (10) Patent No.: US 7,674,563 B2
(45) Date of Patent: Mar. 9, 2010

(54) PATTERN FORMING METHOD AND PHASE SHIFT MASK MANUFACTURING METHOD

(75) Inventor: Hideki Suda, Tokyo (JP)

(73) Assignee: Hoya Corporation, Tokyo (JP)

( * ) Notice: Subject to any disclaimer, the term of this patent is extended or adjusted under 35 U.S.C. 154(b) by 352 days.

(21) Appl. No.: 11/707,131

(22) Filed: Feb. 16, 2007

(65) Prior Publication Data

US 2007/0190434 A1 Aug. 16, 2007

(30) Foreign Application Priority Data

Feb. 16, 2006 (JP) .............................. 2006-039220

(51) Int. Cl.
*G03F 1/00* (2006.01)
*G03F 1/14* (2006.01)
*G03F 7/40* (2006.01)

(52) U.S. Cl. .......................................... 430/5; 430/323

(58) Field of Classification Search ...................... 430/5, 430/323

See application file for complete search history.

(56) References Cited

U.S. PATENT DOCUMENTS

| 5,045,417 | A | * | 9/1991 | Okamoto | 430/5 |
| 6,004,699 | A | * | 12/1999 | Yasuzato et al. | 430/5 |
| 6,030,729 | A | * | 2/2000 | Ito et al. | 430/5 |
| 6,576,374 | B1 | * | 6/2003 | Kim | 430/5 |
| 7,314,690 | B2 | * | 1/2008 | Okubo et al. | 430/5 |
| 2005/0019674 | A1 | * | 1/2005 | Okubo et al. | 430/5 |
| 2005/0148195 | A1 | * | 7/2005 | Koehle et al. | 438/709 |
| 2006/0292454 | A1 | * | 12/2006 | Suda | 430/5 |

FOREIGN PATENT DOCUMENTS

JP 2140743 B2 5/1990

* cited by examiner

*Primary Examiner*—Mark F Huff
*Assistant Examiner*—John Ruggles
(74) *Attorney, Agent, or Firm*—Sughrue Mion, PLLC

(57) ABSTRACT

A phase shift mask manufacturing method comprises the steps of processing a light-shielding layer over a transparent substrate into a predetermined light-shielding pattern, forming a resist film on the predetermined light-shielding pattern, performing writing on the resist film based on writing data and developing the resist film, thereby forming a resist pattern, and etching an underlying layer using the predetermined light-shielding pattern and the resist pattern as a mask, thereby forming recesses, that serve as phase shift portions, in the underlying layer. The writing data includes a portion where pattern data corresponding to at least the two recesses adjacent to each other through a light-shielding portion in the predetermined light-shielding pattern are combined into one pattern data.

7 Claims, 13 Drawing Sheets

PATTERN FORMING METHOD AND PHASE SHIFT MASK MANUFACTURING METHOD

This application claims priority to prior Japanese application JP 2006-39220, the disclosure of which is incorporated herein by reference.

BACKGROUND OF THE INVENTION

This invention relates to a pattern forming method and, in particular, relates to a pattern forming method that processes a coating layer over a substrate into a predetermined pattern by partly removing the coating layer and then forms a recess in an underlying layer below the coating layer at its portion corresponding to at least a portion of a region where the coating layer is removed.

This invention also relates to a method of manufacturing a phase shift mask for use in transferring a fine pattern of an LSI or the like by the use of a projection exposure apparatus.

Following higher integration and circuit pattern miniaturization in large-scale integrated circuits (LSIs), phase shift masks have been proposed and put to practical use as a super-resolution technique in the photolithography.

There have been proposed various types of phase shift masks, such as Levenson type, edge emphasizing type, auxiliary pattern type, chromeless type, and halftone type. For example, the Levenson type phase shift mask has a light-shielding pattern formed by a metal film such as a chromium film, or the like on a transparent substrate. The Levenson type phase shift mask is configured such that, in the case where light-shielding portions and light-transmitting portions are alternately arranged like a line-and-space pattern, the phases of transmitted lights through the light-transmitting portions adjacent to each other via each light-shielding portion are shifted by 180 degrees. Because of the shift in phase between the transmitted lights through the light-transmitting portions, a reduction in resolution due to interference between diffracted lights can be prevented to thereby achieve an improvement in resolution of the line-and-space pattern.

In such a phase shift mask, an optical path length difference of $[\lambda(2m-1)/2]$ (m is a natural number) is generated between transmitted lights, each having a wavelength $\lambda$, through the light-transmitting portions adjacent to each other via the light-shielding portion, thereby causing the phase difference of 180 degrees between the transmitted lights. In order to generate such an optical path length difference, a difference d between the thicknesses of the transparent substrate at the light-transmitting portions adjacent to each other via the light-shielding portion should satisfy $[d=\lambda(2m-1)/2n]$ where n represents a refractive index of the transparent substrate.

In order to generate the difference between the thicknesses of the transparent substrate at the adjacent light-transmitting portions in the phase shift mask, a transparent thin film is coated on the transparent substrate at one of the light-transmitting portions to thereby increase the thickness or the transparent substrate is etched at one of the light-transmitting portions to thereby reduce the thickness. That is, in the shifter coated type (convex type) phase shift mask, the transparent substrate is covered with the transparent thin film (shifter) having the thickness d $(=\lambda(2m-1)/2n)$ at the phase shift portion.

On the other hand, in the etching type phase shift mask in which the transparent substrate is etched, the transparent substrate is etched by the depth d $(=\lambda(2m-1)/2n)$ at the phase shift portion. The light-transmitting portion not coated with the transparent thin film or etched serves as a non-phase-shift portion. Note that in the case where the adjacent light-transmitting portions have a shallow etched portion and a deep etched portion, respectively, the shallow etched portion serves as a non-phase-shift portion.

Further, as a phase shift mask for forming an isolated pattern such as contact holes, the auxiliary pattern type phase shift mask has been proposed as described in Japanese Patent (JP-B) No. 2710967 (Patent Document 1).

Figure 1A:
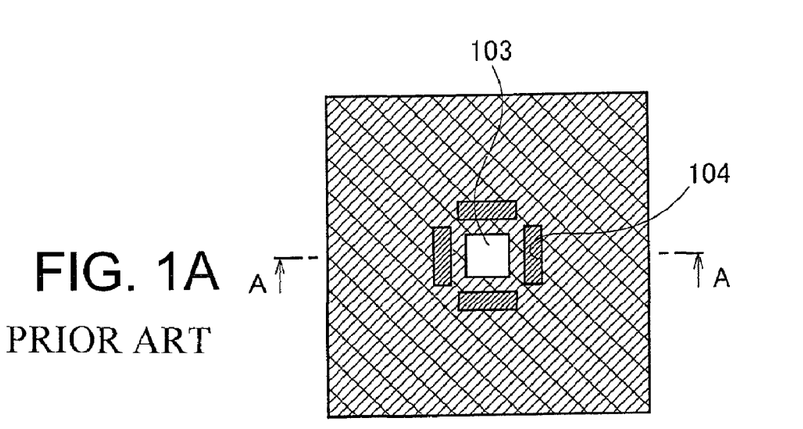
FIG. 1A is a plan view of the auxiliary pattern type phase shift mask (the plan view is the same for both masks) and FIGS. 1B and 1C respectively show sections, each taken along line A-A in FIG. 1A, in terms of two examples.
Figure 1B:
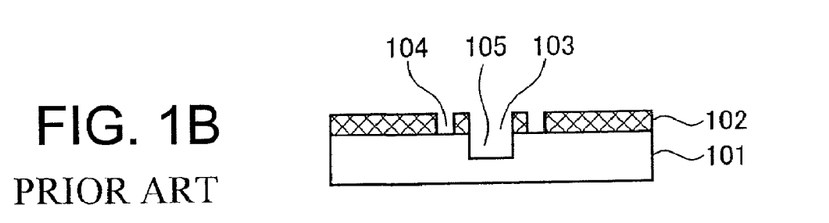
Figure 1C:
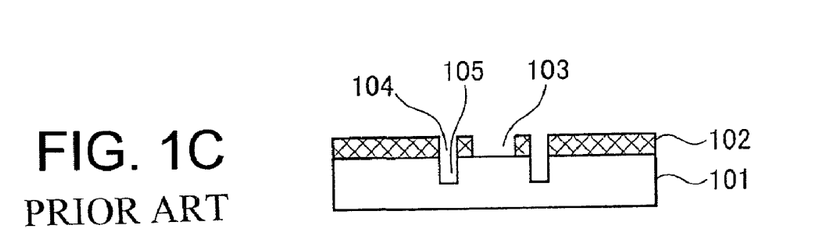

FIGS. 1A to 1C show the structures of auxiliary pattern type phase shift masks, wherein FIG. 1A is a plan view of the auxiliary pattern type phase shift mask (the plan view is the same for both masks) and FIGS. 1B and 1C respectively show sections, each taken along a chain line A-A in FIG. 1A, in terms of two examples.

In FIGS. 1A to 1C, each auxiliary pattern type phase shift mask comprises a transparent substrate 101 and a light-shielding layer 102 formed thereon, wherein the light-shielding layer 102 is formed with a main opening portion (contact hole) 103 and a plurality of auxiliary opening portions 104 located at peripheral portions of the main opening portion 103. It is configured such that light having passed through the main opening portion 103 and light having passed through each auxiliary opening portion 104 have a phase difference of approximately 180 degrees. For this purpose, in the example shown in FIG. 1B, the transparent substrate 101 has an etched portion 105 etched to a predetermined depth in a region corresponding to the main opening portion 103. On the other hand, in the example shown in FIG. 1C, the transparent substrate 101 has etched portions 105, each etched to a predetermined depth, in regions corresponding to the auxiliary opening portions 104, respectively. The auxiliary opening portions 104 are formed at predetermined positions and each have a fine line width so that the light having passed through each auxiliary opening portion 104 does not resolve a resist on a substrate to which a pattern is transferred.

FIGS. 2A to 2G are process diagrams showing a conventional phase shift mask manufacturing method.

Figure 2A:
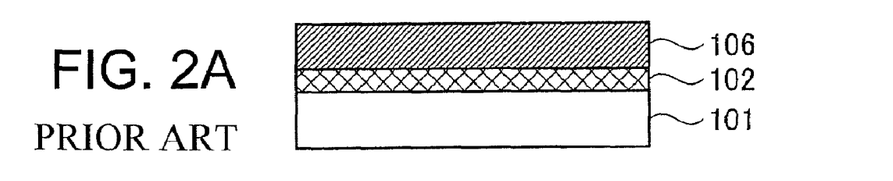
FIGS. 2A to 2G are process diagrams showing a conventional phase shift mask manufacturing method.
Figure 2B:
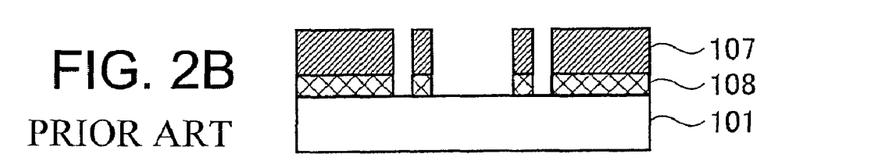
Figure 2C:
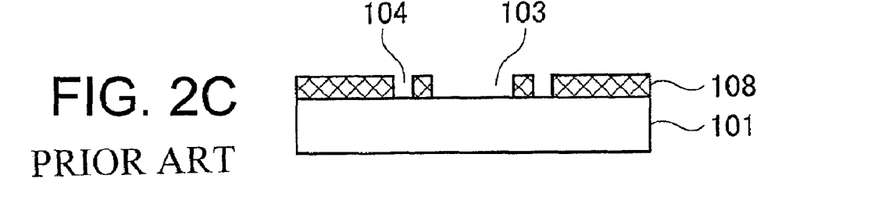

For manufacturing an auxiliary pattern type phase shift mask like that shown in FIG. 1C, a light-shielding layer 102 and a first resist film 106 are first formed on a transparent substrate 101 in the order named as shown in FIG. 2A. Then, as shown in FIG. 2B, the first resist film 106 is written with a pattern corresponding to a main opening portion 103 and a plurality of auxiliary opening portions 104 by the use of, for example, an electron-beam writing apparatus and then developed, thereby forming a first resist pattern 107. Then, the light-shielding layer 102 is etched using the first resist pattern 107 as a mask, thereby forming a light-shielding layer pattern 108 having the main opening portion 103 and the auxiliary opening portions 104. Thereafter, as shown in FIG. 2C, the remaining first resist pattern 107 is stripped.

Figure 2D:
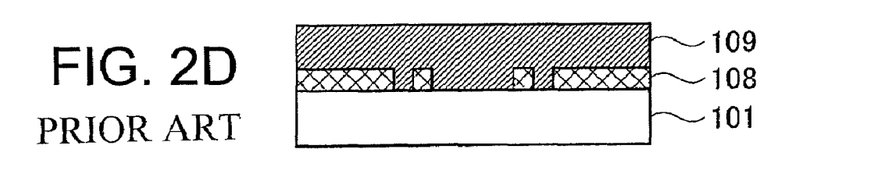
Figure 2E:
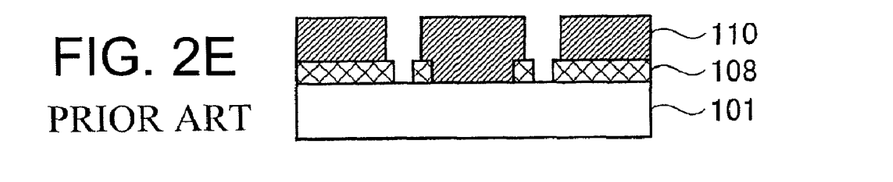
Figure 2F:
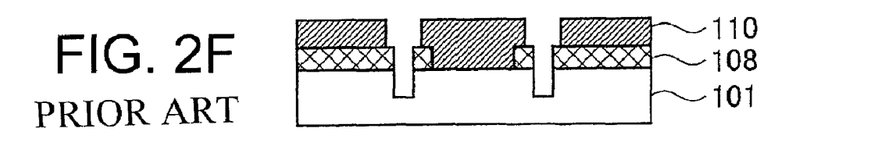
Figure 2G:
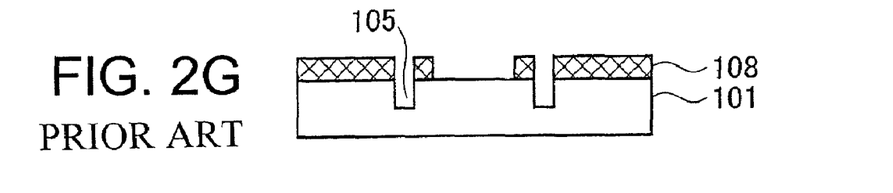

Then, as shown in FIG. 2D, a second resist film 109 is formed on the light-shielding layer pattern 108. Subsequently, as shown in FIG. 2E, the second resist film 109 is written with a pattern corresponding to the auxiliary opening portions 104 by the use of, for example, the electron-beam writing apparatus and then developed, thereby forming a second resist pattern 110. Then, the transparent substrate 101 is etched using the second resist pattern 110 as a mask, thereby forming etched portions 105 as shown in FIG. 2F. Thereafter, as shown in FIG. 2G, the remaining second resist pattern 110 is stripped, thereby completing an auxiliary pattern type phase shift mask.

In the manufacturing method shown in FIGS. 2A to 2G, the transparent substrate 101 is etched in regions corresponding to the auxiliary opening portions 104. However, the same manufacturing method is also applied to the case where the transparent substrate 101 is etched in a region corresponding to the main opening portion 103. That is, in FIG. 2E, the second resist film 109 is written with a pattern corresponding to the main opening portion 103 and then developed, thereby forming a second resist pattern. Subsequently, the transparent substrate 101 is etched using this second resist pattern as a mask, thereby forming an etched portion 105 like that shown in FIG. 1B.

Following the miniaturization and higher integration of LSIs in recent years, pattern data amounts for manufacturing phase shift masks have been increasing. Particularly, in each of the auxiliary pattern type phase shift masks as described above, since four auxiliary opening portions are required with respect to one main opening portion (contact hole) as shown in FIG. 1A, the pattern data amount increases four times.

When the pattern data amount increases, a long time is required for data processing and, further, a long time is also required for writing on a resist film. Particularly, in recent years, since the electron-beam writing method has shifted from the raster scan type to the vector scan type for improving the pattern accuracy, an increase in pattern data amount directly leads to an increase in the number of figures to be written, thus directly leading to an increase in writing time. Accordingly, it is desired to reduce the pattern data amount as much as possible, thereby minimizing the writing time.

Further, since an auxiliary opening pattern that is not resolved on a substrate to which a pattern is transferred is arranged around a main opening portion (contact hole), there arises a problem in mask fabrication due to limitation to a layout manner or occurrence of an irregular layout depending on design of an LSI.

Figure 3A:
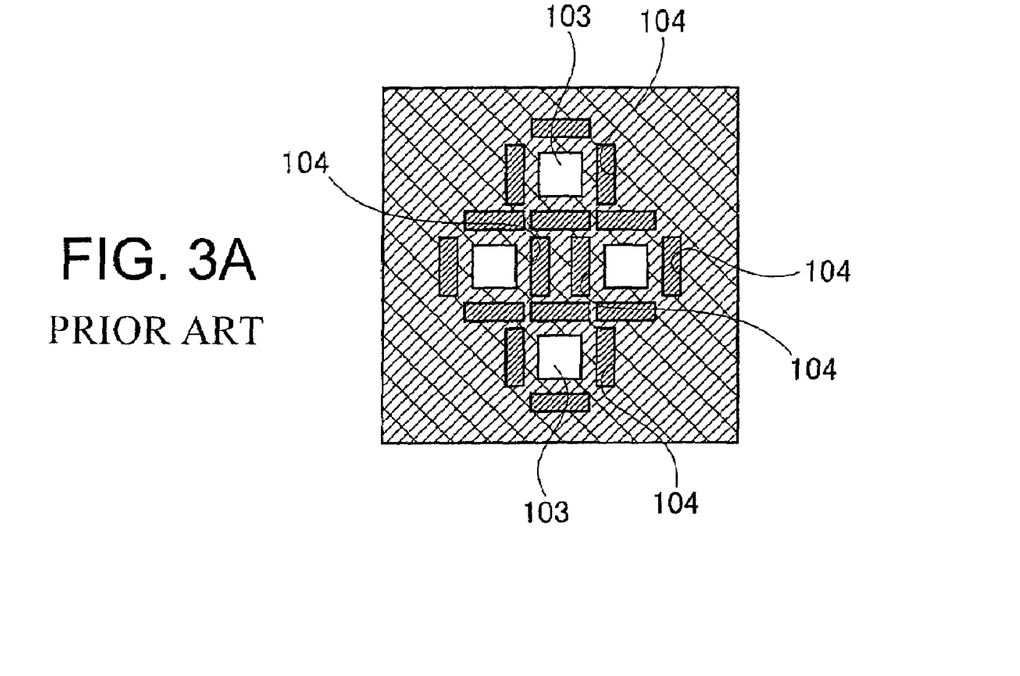
FIGS. 3A and 3B are plan views showing a pattern layout in which part of auxiliary opening portions formed around respective main opening portions are adjacent to each other, in a conventional phase shift mask manufacturing method.
Figure 3B:
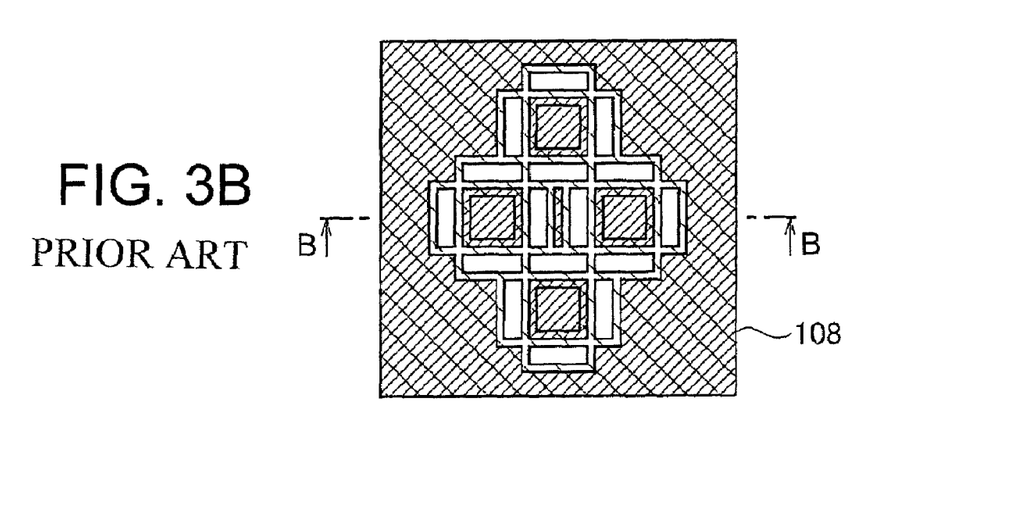
Figure 4A:
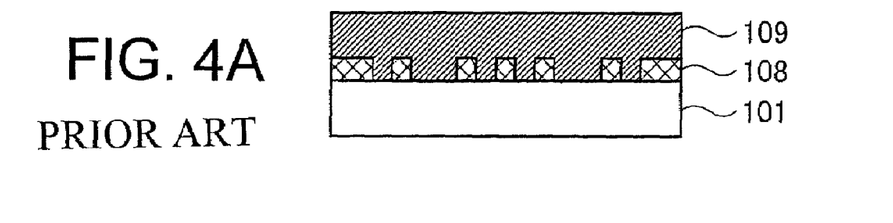
FIGS. 4A to 4E show, in terms of sections taken along line B-B in FIG. 3B, manufacturing processes in the case where the pattern layout as shown in FIG. 3A is present, in the conventional phase shift mask manufacturing method.
Figure 4B:
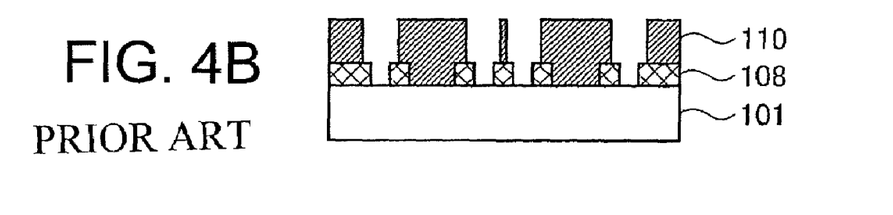
Figure 4C:
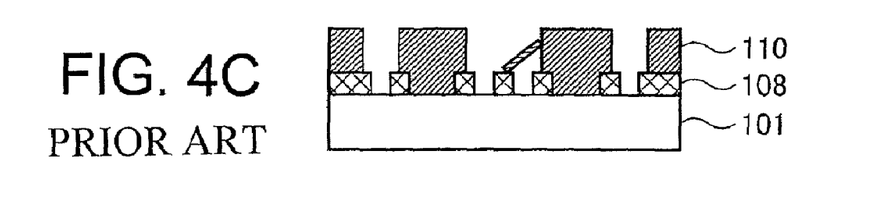
Figure 4D:
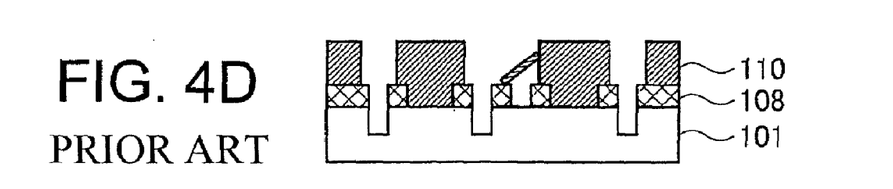
Figure 4E:
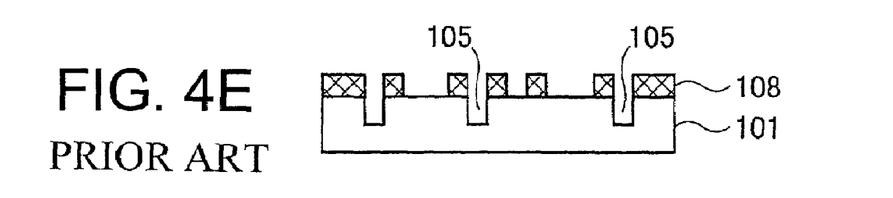

For example, as shown in FIG. 3A, there is a case where a pattern layout is required in which a plurality of combinations each having a main opening portion 103 and auxiliary opening portions 104 are arranged so that some of the auxiliary opening portions 104 are adjacent to each other. That is, the main opening portions 103 are respectively arranged at portions corresponding to four corners of a diamond shape and four auxiliary opening portions 104 are arranged around each main opening portion 103. Therefore, some of the auxiliary opening portions 104 must be arranged adjacent to each other. In this case, as shown in FIG. 4A, a positive-type resist film 109 is formed on a light-shielding layer pattern 108, then, as shown in FIGS. 3B and 4B, the positive-type resist film 109 is written with a pattern corresponding to the auxiliary opening portions 104 by the use of an electron-beam writing apparatus and then developed, thereby forming a resist pattern 110. In this case, a region surrounded on all sides by openings corresponding to the auxiliary opening portions 104 is generated in the resist pattern 110. Accordingly, the resist pattern 110 has an extremely thin portion and, therefore, as shown in FIGS. 4C and 4D, there is a possibility that this portion falls down during development to cover, for example, one of the auxiliary opening portions 104. If, in this manner, the part of the resist pattern 110 falls down to close the opening portion, a transparent substrate 101 is not etched at the closed portion as shown in FIGS. 4D and 4E, resulting in occurrence of a defect.

SUMMARY OF THE INVENTION

It is an object of this invention to provide a manufacturing method of a phase shift mask, such as an auxiliary pattern type phase shift mask, that can achieve a reduction in writing data amount.

It is another object of this invention to provide a phase shift mask manufacturing method that can suppress occurrence of a defect which depends on a pattern layout, and thus can manufacture a phase shift mask accurately and efficiently.

This invention is not limited to the phase shift mask manufacturing method, but is also applicable to a pattern forming method for processing a coating layer over a substrate into a predetermined pattern by partly removing the coating layer and then forming recesses in an underlying layer below the coating layer at least a part of where the coating layer is removed. Accordingly, it is an object of this invention to provide a pattern forming method that can achieve a reduction in writing data amount and suppress occurrence of a defect which depends on a pattern layout, and thus can perform pattern formation accurately and efficiently.

(First Aspect)

According to a first aspect of this invention, a pattern forming method is provided. The pattern forming method is for processing a coating layer over a substrate into a predetermined pattern by partly removing the coating layer and then forming recesses in an underlying layer below the coating layer at least a part of where the coating layer is removed. The pattern forming method comprises the steps of processing the coating layer into the predetermined pattern, forming a resist film on the coating layer processed into the predetermined pattern, performing writing on the resist film based on writing data and developing the resist film, thereby forming a resist pattern, and etching the underlying layer using the coating layer processed into the predetermined pattern and the resist pattern as a mask, thereby forming the recesses in the underlying layer. The writing data includes a portion where pattern data corresponding to at least the two recesses adjacent to each other through a remaining portion of the coating layer processed into the predetermined pattern are combined into one pattern data.

(Second Aspect)

According to a second aspect of this invention, a phase shift mask manufacturing method is provided. The phase shift mask manufacturing method is for processing a light-shielding layer over a transparent substrate into a predetermined pattern by partly removing the light-shielding layer and then forming recesses, that serve as phase shift portions, in an underlying layer below the light-shielding layer at least a part of where the light-shielding layer is removed. The phase shift mask manufacturing method comprises the steps of processing the light-shielding layer into a light-shielding pattern having the predetermined pattern, forming a resist film on the light-shielding pattern, performing writing on the resist film based on writing data and developing the resist film, thereby forming a resist pattern, and etching the underlying layer using the light-shielding pattern and the resist pattern as a mask, thereby forming the recesses in the underlying layer. The writing data includes a portion where pattern data corresponding to at least the two recesses adjacent to each other through a light-shielding portion of the light-shielding pattern are combined into one pattern data.

(Third Aspect)

In the pattern forming method according to the first aspect and the phase shift mask manufacturing method according to the second aspect, it is preferable that the underlying layer is the transparent substrate.

In this invention, the writing data to be used in writing on the resist film formed on the coating layer (or the light-shielding layer) includes a portion where pattern data corresponding to at least two recesses adjacent to each other through a remaining portion in the coating layer (or through a light-shielding portion in a light-shielding pattern) are combined into one pattern data and, therefore, the pattern data amount can be reduced. Further, since it is possible to suppress occurrence of a defect that depends on a pattern layout, fabrication can be carried out accurately and efficiently.

That is, this invention can achieve a reduction in writing data amount in a manufacturing method of a phase shift mask such as an auxiliary pattern type phase shift mask. Further, according to the manufacturing method of this invention, it is possible to suppress occurrence of a defect that depends on a pattern layout, thereby manufacturing the phase shift mask accurately and efficiently.

This invention can achieve a reduction in writing data amount even when applied to a pattern forming method adapted to process a coating layer over a substrate into a predetermined pattern by partly removing the coating layer and then forming recesses in an underlying layer below the coating layer, where at least a part of the coating layer is removed. Further, according to this pattern forming method, it is possible to suppress occurrence of a defect that depends on a pattern layout, thereby carrying out pattern formation accurately and efficiently.

BRIEF DESCRIPTION OF THE DRAWINGS

FIGS. 1A to 1C show the general structures of auxiliary pattern type phase shift masks, wherein

DESCRIPTION OF THE PREFERRED EMBODIMENTS

Referring now to the drawings, a description will hereinbelow be given in detail of embodiments of pattern forming methods according to this invention. In each of the following embodiments, the pattern forming method according to this invention is applied to a phase shift mask manufacturing method. However, this invention is not limited to the phase shift mask manufacturing method. That is, in the following description, a transparent substrate can be any one of various substrates including those that are not transparent and a light-shielding layer can be any one of various coating layers.

First Embodiment

Figure 5A:
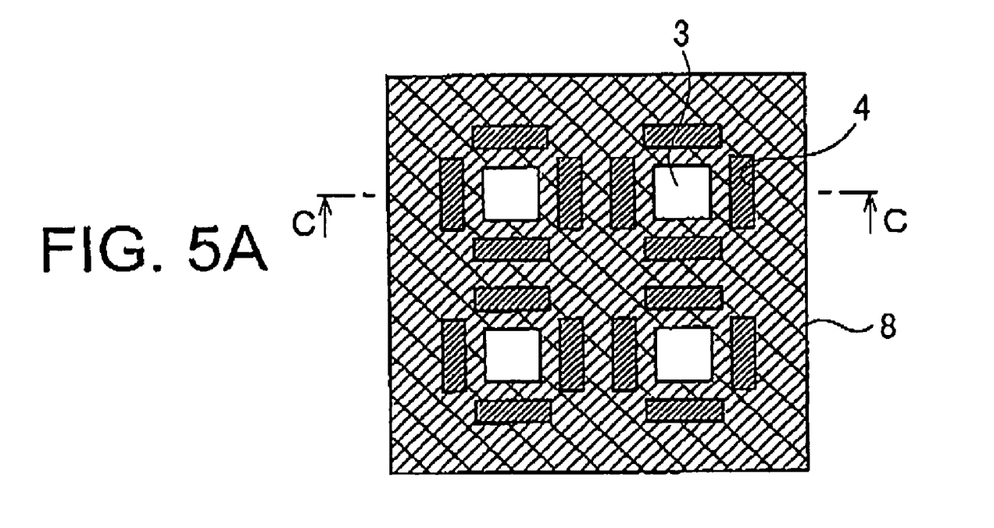
FIGS. 5A and 5B are plan views for explaining a structure of a phase shift mask manufactured by a first embodiment of a phase shift mask manufacturing method according to this invention.
Figure 5B:
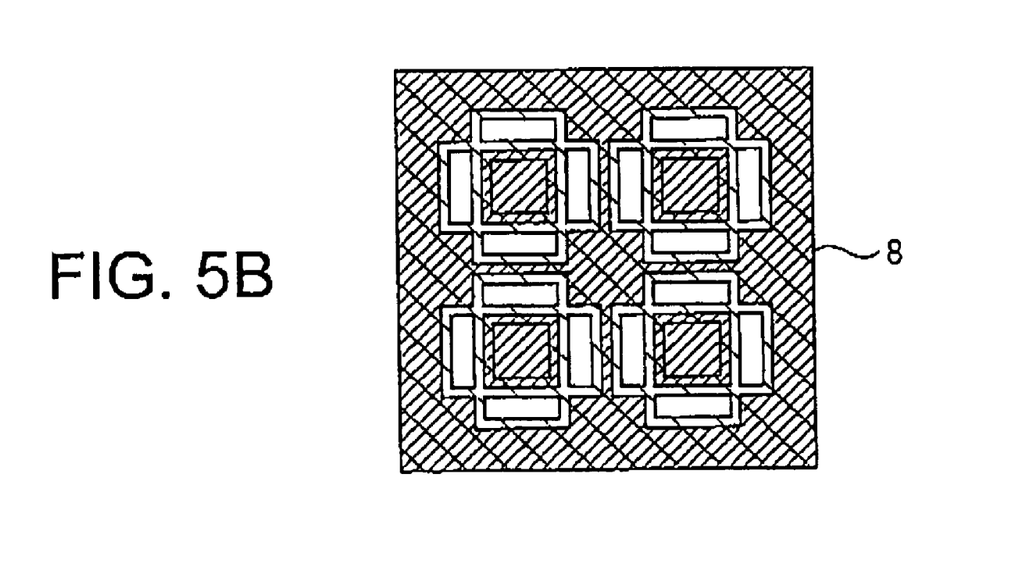

FIGS. 5A and 5B are plan views for explaining a structure of a phase shift mask manufactured by a first embodiment of a phase shift mask manufacturing method according to this invention.

FIGS. 6A to 6G are process diagrams showing the first embodiment of the phase shift mask manufacturing method according to this invention.

In the first embodiment, a description will be given of the case of manufacturing an auxiliary pattern type phase shift mask in which four main opening portions 3 are arranged in two rows and two columns as shown in FIG. 5A. Four auxiliary opening portions 4 are arranged around each main opening portion 3. In this case, there exist four pairs each including the two auxiliary opening portions 4 with their long sides adjacent to each other.

Figure 6A:
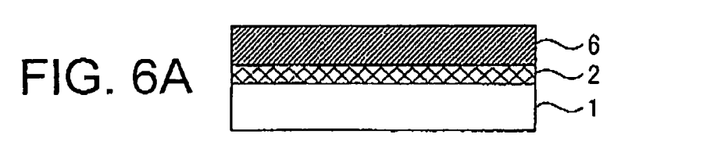
FIGS. 6A to 6G are process diagrams showing the first embodiment of the phase shift mask manufacturing method according to this invention in terms of sections taken along line C-C in FIG. 5A.
Figure 6B:
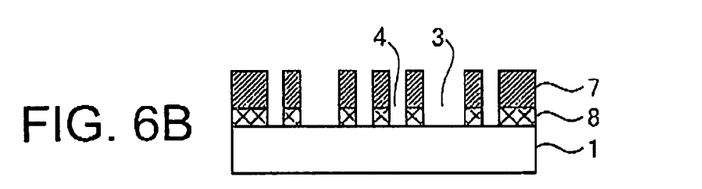
Figure 6C:
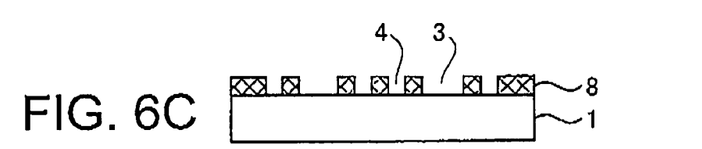

In the phase shift mask manufacturing method according to the first embodiment, in order to manufacture an auxiliary pattern type phase shift mask, a light-shielding layer (or a coating layer) 2 and a first resist film 6 are first formed on a transparent substrate 1 in the order named as shown in FIG. 6A. In this case, an underlying layer below the light-shielding layer 2 is the transparent substrate 1. Then, as shown in FIG. 6B, the first resist film 6 is written with a pattern corresponding to a main opening portion 3 and auxiliary opening portions 4 by the use of, for example, an electron-beam writing apparatus and then developed, thereby forming a first resist pattern 7. Then, the light-shielding layer 2 is etched using the first resist pattern 7 as a mask, thereby forming a light-shielding layer pattern (light shielding pattern) 8 having the main opening portion 3 and the auxiliary opening portions 4 (FIG. 6C). Thereafter, as shown in FIG. 6C, the remaining first resist pattern 7 is stripped.

Figure 6D:
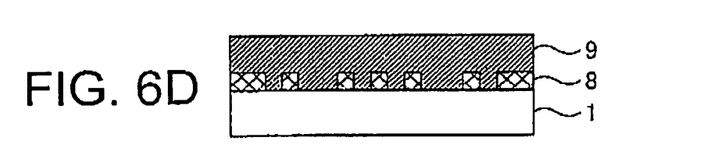
Figure 6E:
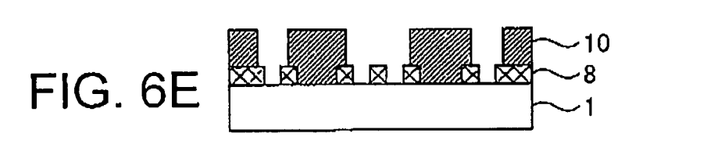
Figure 6F:
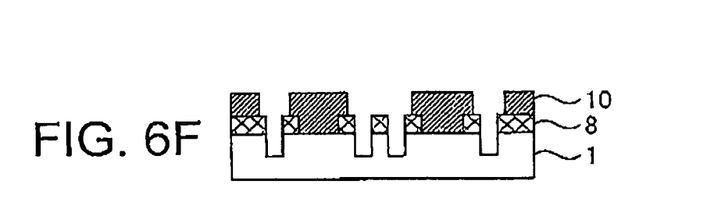

Then, as shown in FIG. 6D, a second resist film 9 is formed on the light-shielding layer pattern 8. Subsequently, as shown in FIG. 6E, the second resist film 9 is written with a pattern corresponding to the auxiliary opening portions 4 by the use of, for example, the electron-beam writing apparatus and then developed, thereby forming a second resist pattern 10.

Figure 7A:
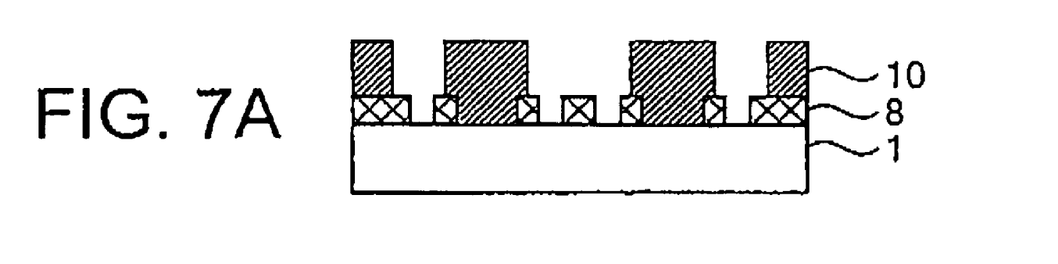
FIG. 7A is a sectional view for explaining a process of forming a second resist film into a resist pattern in the phase shift mask manufacturing method according to this invention.
Figure 7B:
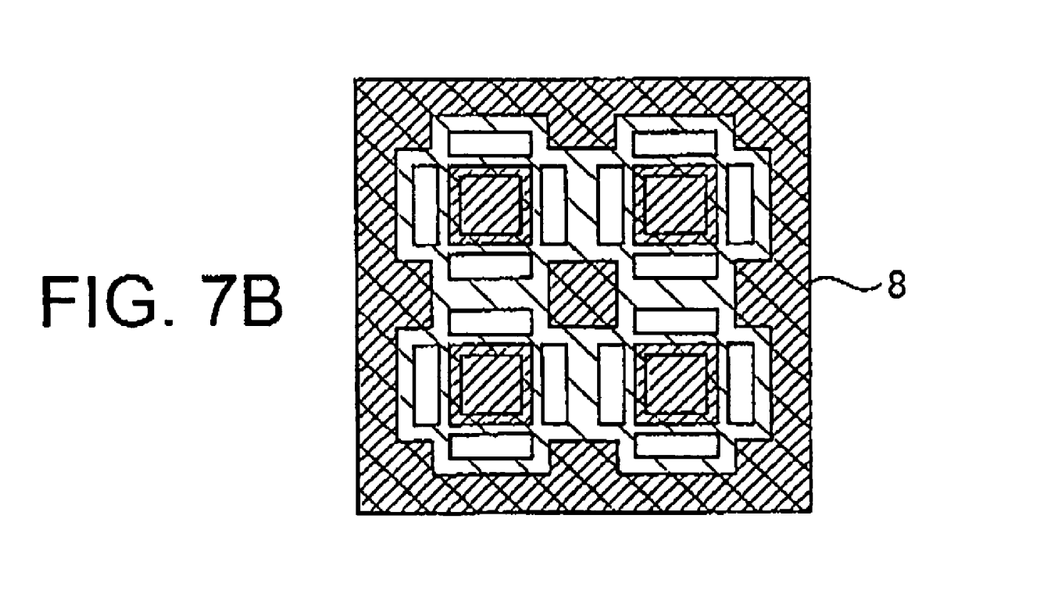
FIG. 7B is a plan view showing writing data for writing the resist pattern on the second resist film in the phase shift mask manufacturing method according to this invention.

FIG. 7A is a sectional view (corresponding to FIG. 6E) for explaining the process of forming the second resist film 9 into the second resist pattern 10 and FIG. 7B is a plan view showing writing data for writing the second resist pattern 10 on the second resist film 9.

In the writing data to be written on the second resist film 9 for forming the second resist pattern 10, the adjacent two auxiliary opening portions are combined into one pattern data as shown in FIG. 7B.

Figure 8A:
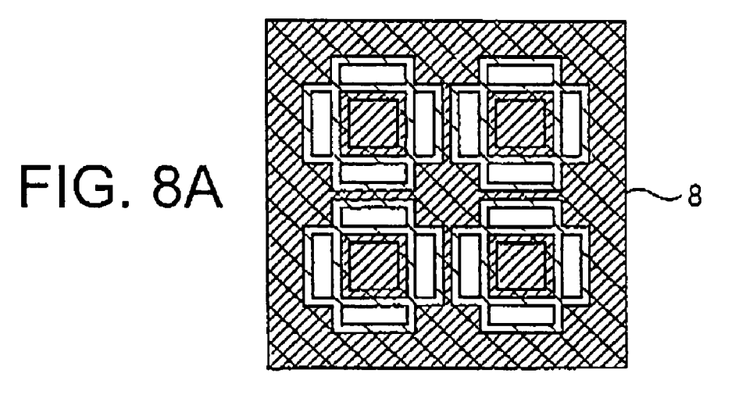
FIGS. 8A to 8C are plan views showing writing data to be used in the phase shift mask manufacturing method according to this invention, particularly for explaining, in sequence, a method of combining adjacent two auxiliary opening portions into one pattern data.
Figure 8B:
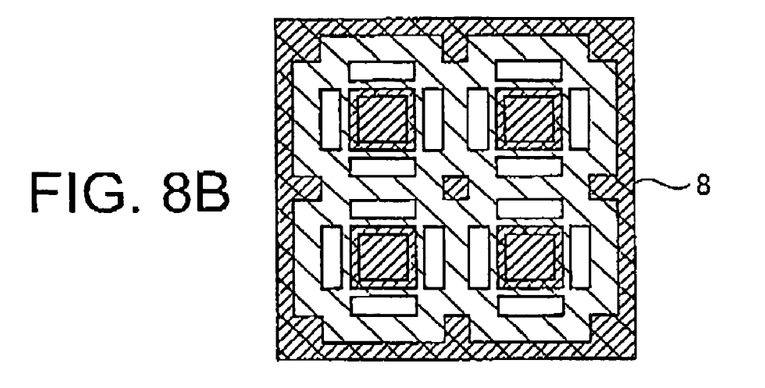
Figure 8C:
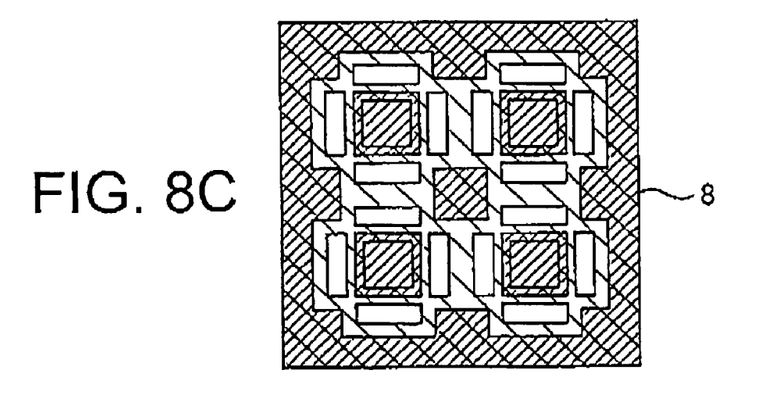

FIGS. 8A to 8C are plan views for explaining a method of combining the adjacent two auxiliary opening portions into one pattern data in the writing data.

In the initial state of the writing data, as shown in FIG. 8A, pattern data corresponding to each auxiliary opening portion is set to a size slightly larger than the auxiliary opening portion (plus sizing), thereby adapted to an overlay error. Then, in order to combine the pattern data corresponding to the adjacent two auxiliary opening portions into one pattern data, plus sizing is further applied thereto to cause the pattern data corresponding to the adjacent two auxiliary opening portions to be continuous with each other as shown in FIG. 8B, thereby combining them into one pattern data. Then, as shown in FIG. 8C, minus sizing is applied to the writing data in which the two pattern data are combined into the one pattern data, thereby returning the respective pattern data to the initial size. In this event, the portions that have once become continuous with each other to form the one pattern data are never divided again into the two pattern data by the minus sizing, i.e. only the peripheries are subjected to the minus sizing.

By carrying out such data processing in advance, the pattern data corresponding to the 16 auxiliary opening portions 4 in total arranged around the respective four main opening portions 3 are reduced to 12 pattern data in total in the first embodiment.

Figure 9A:
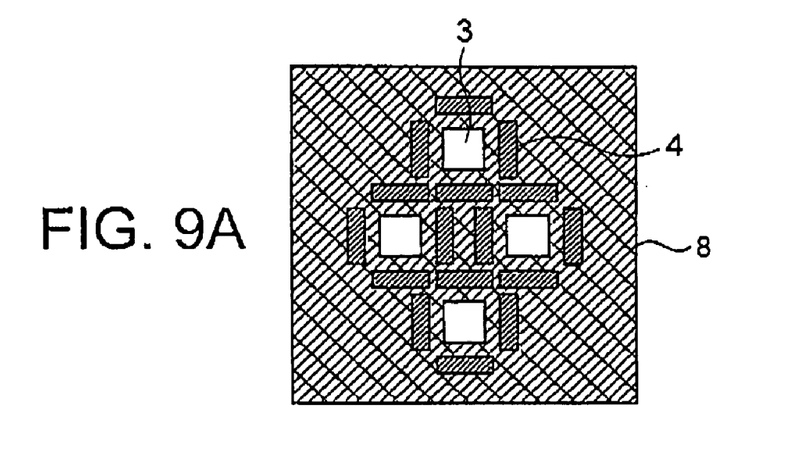
FIGS. 9A to 9C are plan views for explaining another example of writing data to be written on a second resist film in the phase shift mask manufacturing method according to this invention.
Figure 9B:
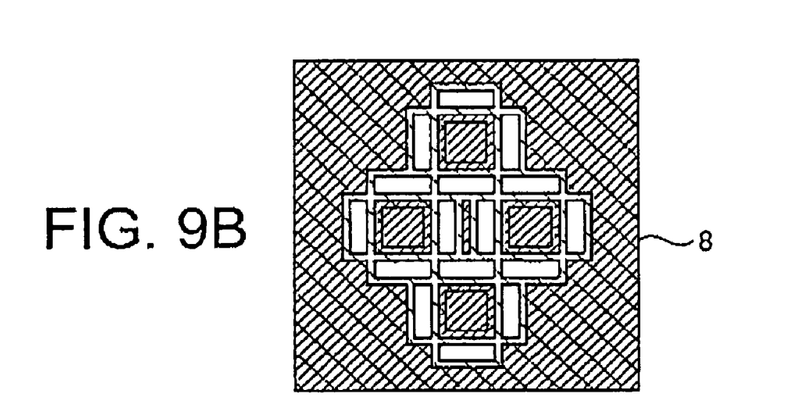
Figure 9C:
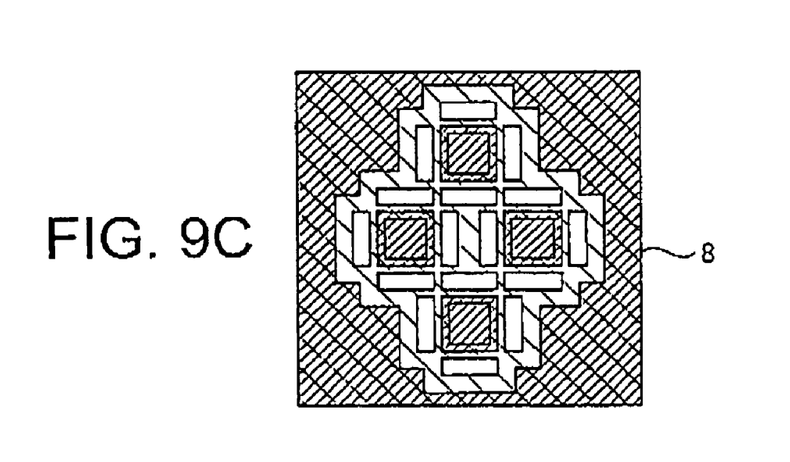

FIGS. 9A to 9C are plan views showing another example of writing data to be written on a second resist film 9 (FIG. 6D). In this example, main opening portions 3 are respectively arranged at portions corresponding to four corners of a diamond shape and four auxiliary opening portions 4 are arranged around each main opening portion 3. In this case, there exists only one pair including the two auxiliary opening portions 4 with their long sides adjacent to each other and pattern data corresponding to at least this portion is reduced.

By the data processing as described above, the second resist pattern 10 (FIG. 6E) is prevented from formation of an extremely thin portion in the pattern layout having the portion sandwiched between the long sides of the auxiliary opening portions as shown in FIG. 7B or in the pattern layout having the portion surrounded on all sides by the long sides of the auxiliary opening portions as shown in FIG. 9C. Therefore, it is possible to avoid the problem that an extremely thin portion falls down during development of the second resist film 9 to cover the corresponding auxiliary opening portion. As described before, if the extremely thin portion of the resist pattern falls down to close the opening portion, the transparent substrate is not etched at the closed portion, resulting in occurrence of a defect.

Figure 6G:
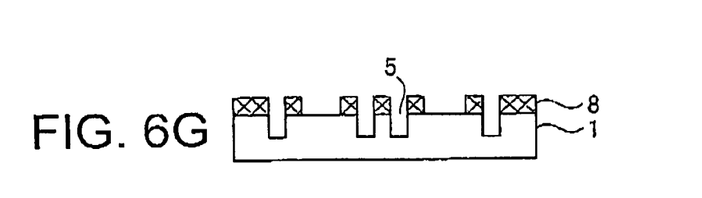

Referring back to FIG. 6F, the transparent substrate 1 is etched using the light-shielding pattern 8 and the second resist pattern 10 as a mask, thereby forming etched portions (recesses) 5 in the transparent substrate 1. Thereafter, as shown in FIG. 6G, the remaining second resist pattern 10 is stripped, thereby completing an auxiliary pattern type phase shift mask.

As described above, in the first embodiment, writing data to be used in writing on the second resist film 9 formed on the light-shielding pattern 8 includes a portion where pattern data corresponding to at least the two etched portions 5 adjacent to each other through a light-shielding portion in the light-shielding pattern 8 are combined into one pattern data and, therefore, the pattern data amount can be reduced. Further, since it is possible to suppress occurrence of a defect that depends on a pattern layout, fabrication can be carried out accurately and efficiently.

In this invention, the method of combining pattern data corresponding to adjacent two auxiliary opening portions into one pattern data is not limited to the foregoing method that performs the plus sizing and the minus sizing. For example, it may be a method that performs data processing of detecting an interval between adjacent two auxiliary opening portions, specifying a portion where this interval is shorter than a predetermined interval, and deleting the specified portion.

Second Embodiment

Figure 10A:
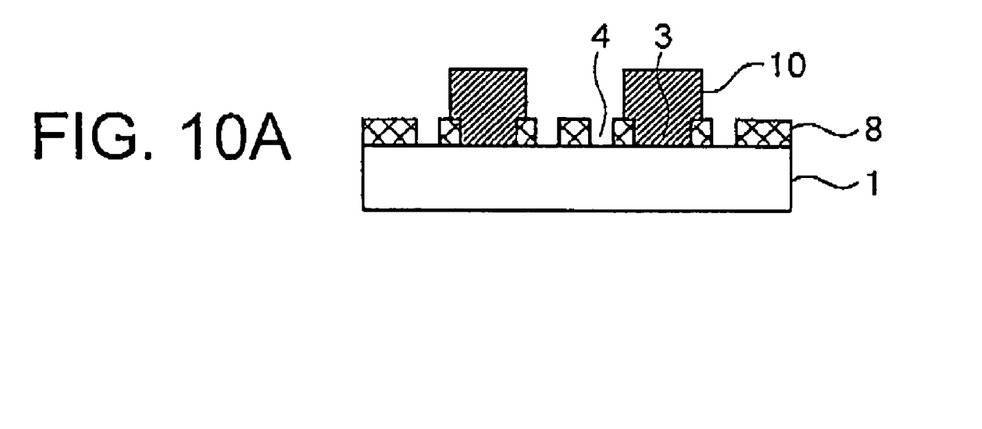
FIGS. 10A and 10B are a sectional view and a plan view, respectively, for explaining a second embodiment of a phase shift mask manufacturing method according to this invention.
Figure 10B:
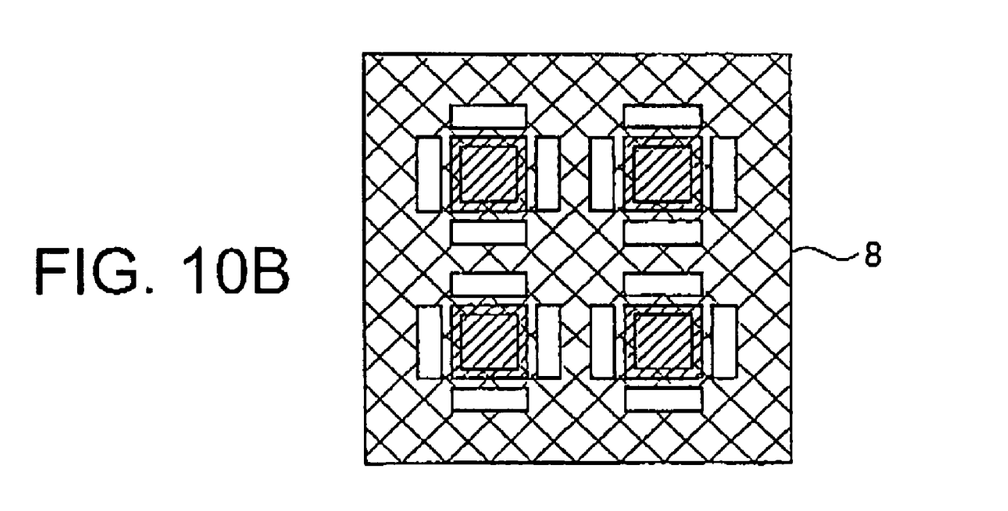

FIGS. 10A and 10B are a sectional view and a plan view, respectively, showing a second embodiment of a phase shift mask manufacturing method according to this invention.

In the first embodiment, the positive-type resist is used when forming the second resist pattern 10. However, a negative-type resist may also be used in the phase shift mask manufacturing method according to this invention.

Therefore, in the second embodiment, a negative-type resist is used as the second resist film 9 in FIG. 6D in the first embodiment and, as shown in FIG. 10B, pattern data corresponding to the main opening portions 3 are used as writing data for forming a second resist pattern 10 instead of the pattern data corresponding to the auxiliary opening portions 4. In the case where the negative-type resist is used as the second resist film 9, the second resist film 9 is left remaining by writing in the regions of the main opening portions 3 where the etched portions 5 are not formed, while, the second resist film 9 is removed by development in the regions of the auxiliary opening portions 4 where the etched portions 5 are formed. In this case, the writing can be performed only by four pattern data corresponding to the four main opening portions 3.

In this case, although the etched portions 5 are formed in all the regions of other than the main opening portions, the second resist film 9 is left remaining in predetermined regions according to necessity so as not to lose monitor marks, alignment marks, or the like.

Also in the second embodiment, the pattern data amount can be reduced and it is possible to suppress occurrence of a defect that depends on a pattern layout, and therefore, fabrication can be carried out accurately and efficiently.

In the first and second embodiments, the light-shielding layer 2 is used as a coating layer. However, a coating layer is not limited to a single layer and, for example, may be comprised of the light-shielding layer 2 and a light-semitransmitting layer formed under it. In this case, it may be configured, for example, such that the light-shielding layer 2 is formed by a film made of a chromium-based material and the light-semitransmitting layer is formed by a film made of a molybdenum silicide based material, thereby removing a part or the whole of the coating layer with the light-semitransmitting layer left remaining after the process shown in FIG. 6G.

First Example

Hereinbelow, a description will be given of a first example of a phase shift mask manufacturing method according to this invention.

As a transparent substrate, there was prepared a quartz glass substrate having mirror-polished surfaces and subjected to predetermined cleaning. This transparent substrate had a 6-inch square size with a thickness of 0.25 inches. At first, a light-shielding layer made of chromium and having a thickness of 100 nm was formed on the transparent substrate by sputtering. Then, as a first resist film, a positive-type electron-beam resist ("ZEP7000" manufactured by Zeon Corporation) was coated to a thickness of 400 nm on the light-shielding layer by spin coating.

Then, the first resist film was written with a pattern corresponding to a main opening portion and auxiliary opening portions by the use of an electron-beam writing apparatus and then developed, thereby forming a first resist pattern. Then, dry etching using a mixed gas of $Cl_2$ and $O_2$ was applied to the light-shielding layer using the first resist pattern as a mask, thereby forming a light-shielding layer pattern having the main opening portion and the auxiliary opening portions. Thereafter, the remaining first resist pattern was stripped.

Then, as a second resist film, a positive-type electron-beam resist ("ZEP7000" manufactured by Zeon Corporation) was coated to a thickness of 400 nm on the light-shielding layer pattern by spin coating. Subsequently, the second resist film was written with a pattern corresponding to the auxiliary opening portions by the use of the electron-beam writing apparatus and then developed, thereby forming a second resist pattern.

In writing the pattern corresponding to the auxiliary opening portions, the following data processing was carried out.

FIGS. 11A to 11E are plan views showing, in an enlarged manner, a portion where pattern data corresponding to the auxiliary opening portions are adjacent to each other.

Figure 11A:
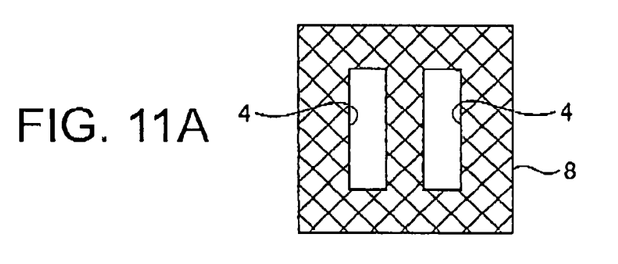
FIGS. 11A to 11E are plan views showing, in an enlarged manner, a pattern having a portion where openings corresponding to auxiliary opening portions are adjacent to each other, in the phase shift mask manufacturing method according to this invention.
Figure 11B:
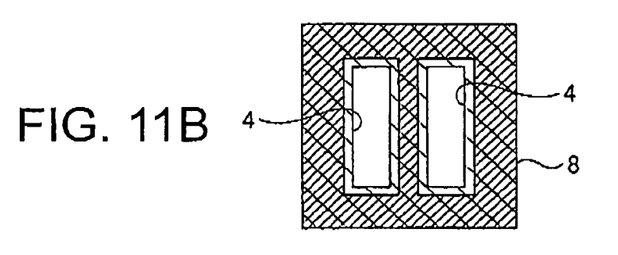
Figure 11C:
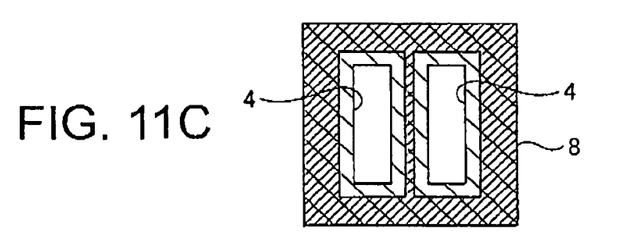
Figure 11D:
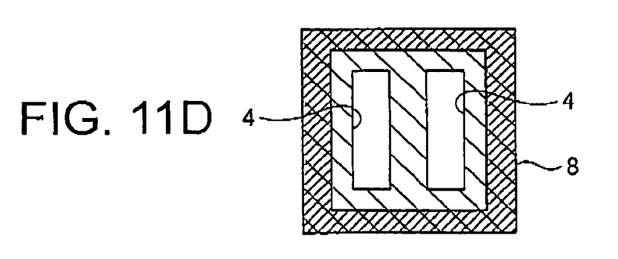
Figure 11E:
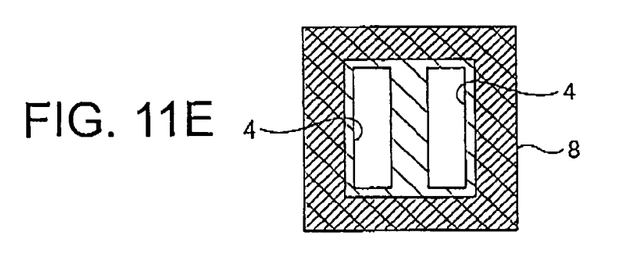

In this first example, each of the auxiliary opening portions shown in FIG. 11A has a short-side direction size of 160 nm, wherein the distance between the auxiliary opening portions is 120 nm. In pattern data corresponding to each of the auxiliary opening portions, as shown in FIG. 11B, 20 nm is added to each of four sides of the auxiliary opening portion in the light-shielding pattern (plus sizing) in consideration of alignment offset (overlay offset) and, therefore, a pattern defined by each of the two pattern data has a short-side direction size of 200 nm and the distance between the adjacent two patterns is 80 nm. Then, as shown in FIG. 11C, 40 nm is further added to each of four sides of each pattern data for filling up the gap between the adjacent two patterns, thereby causing the adjacent two patterns to be in contact (continuous) with each other. By causing the adjacent two patterns to be in contact (continuous) with each other, the two pattern data are combined into one pattern data as shown in FIG. 11D. Then, as shown in FIG. 11E, 40 nm is subtracted from each of four sides of the combined pattern data to return the overlay margin to the initial value of 20 nm, thereby completing the data processing.

Then, dry etching using a mixed gas of $CHF_3$ and $O_2$ was applied to the transparent substrate using the second resist pattern as a mask, thereby forming recesses each having a thickness of 170 nm in the transparent substrate. Thereafter, the remaining second resist pattern was stripped.

The auxiliary pattern type phase shift mask manufactured through the foregoing processes was subjected to a defect inspection again thereafter, but no residue-defect portion was detected, and further, excellent results were obtained also in transfer.

In this first example, by performing the data processing of the pattern data corresponding to the auxiliary opening portions, the number of pattern data was reduced by approximately 16% and the electron-beam writing time for forming the second resist pattern was reduced by approximately 10% as compared with the conventional manufacturing method.

Figure 12A:
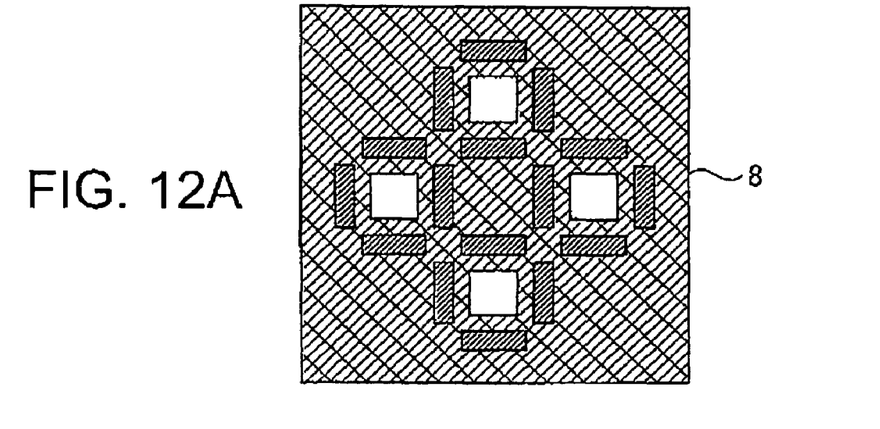
FIGS. 12A to 12C are plan views for explaining still another example of writing data to be written on a second resist film in the phase shift mask manufacturing method according to this invention.
Figure 12B:
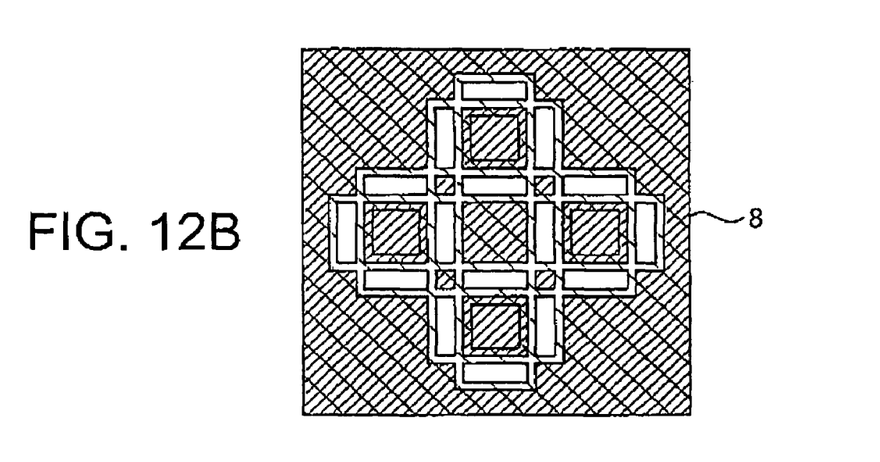
Figure 12C:
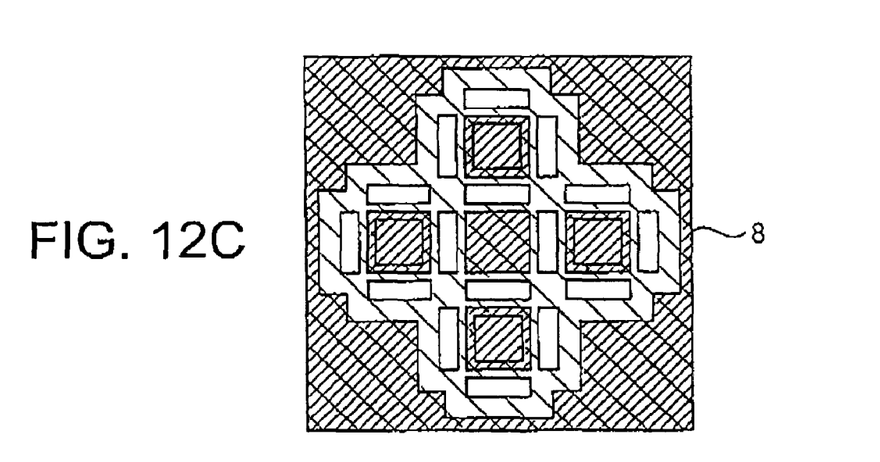

FIGS. 12A to 12C are plan views for explaining still another example of writing data to be written on the second resist film 9.

In the other example, there exists a pattern layout having a portion surrounded on all sides by long sides of four auxiliary opening portions as explained referring to FIGS. 9A to 9C or a pattern layout having a portion surrounded on all sides by short sides of four auxiliary opening portions as shown in FIG. 12B. In either case, the second resist pattern 10 was prevented from formation of an extremely thin portion and there were obtained excellent results in the etching of the transparent substrate.

Second Example

A description will be given of a second example of a phase shift mask manufacturing method according to this invention.

FIGS. 13A to 13G are process diagrams showing a second example of a phase shift mask manufacturing method according to this invention.

Figure 13A:
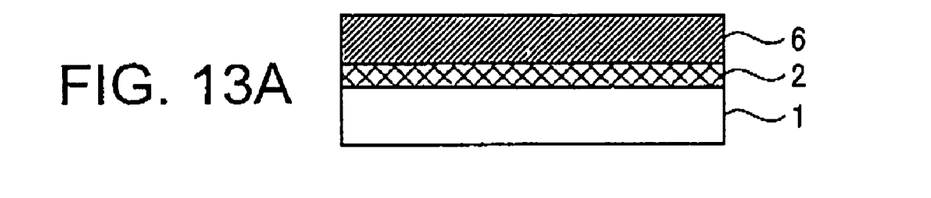
FIGS. 13A to 13G are process diagrams showing a second example of a phase shift mask manufacturing method according to this invention.

As a transparent substrate, there was prepared a quartz glass substrate having mirror-polished surfaces and subjected to predetermined cleaning. This transparent substrate had a 6-inch square size with a thickness of 0.25 inches. At first, a light-shielding layer 2 made of chromium and having a thickness of 100 nm was formed on the transparent substrate 1 by sputtering as shown in FIG. 13A. Then, as a first resist film 6, a positive-type electron-beam resist ("ZEP7000" manufactured by Zeon Corporation) was coated to a thickness of 400 nm on the light-shielding layer 2 by spin coating.

Figure 13B:
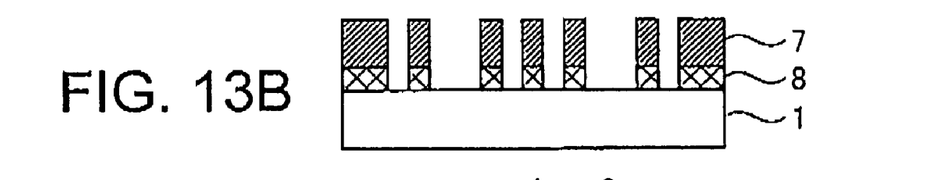
Figure 13C:
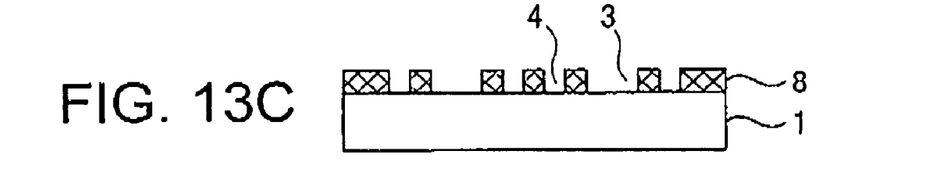
Figure 13D:
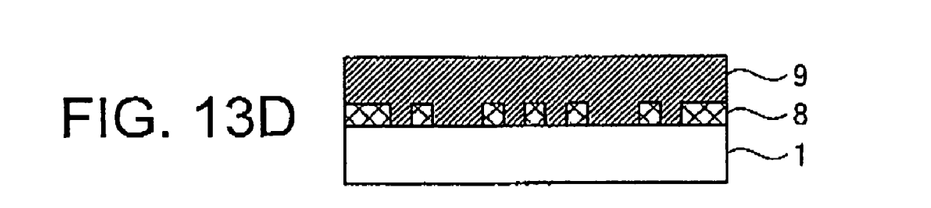

Then, as shown in FIG. 13B, the first resist film 6 was written with a pattern corresponding to the main and the auxiliary opening portions by the use of an electron-beam writing apparatus and then developed, thereby forming a first resist pattern 7. Then, dry etching using a mixed gas of $Cl_2$ and $O_2$ was applied to the light-shielding layer 2 using the first resist pattern 7 as a mask, thereby forming a light-shielding layer pattern 8 having the opening portions. Thereafter, the remaining first resist pattern 7 was stripped as shown in FIG. 13C.

Figure 13E:
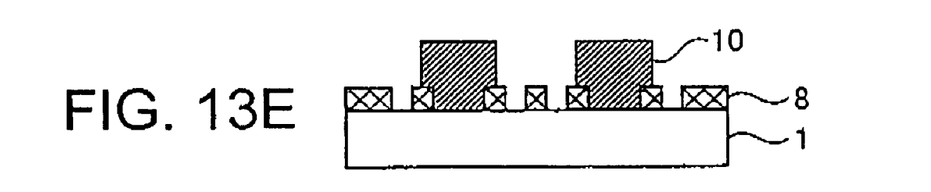

Then, as a second resist film 9, a nega-type electron-beam resist ("SAL601" manufactured by Shipley Corporation) was coated to a thickness of 400 nm on the light-shielding layer pattern 8 by spin coating. Subsequently, the second resist film 9 was written with a pattern corresponding to a main opening portion 3 by the use of the electron-beam writing apparatus and then developed, thereby forming a second resist pattern 10 as shown in FIG. 13E.

Figure 13F:
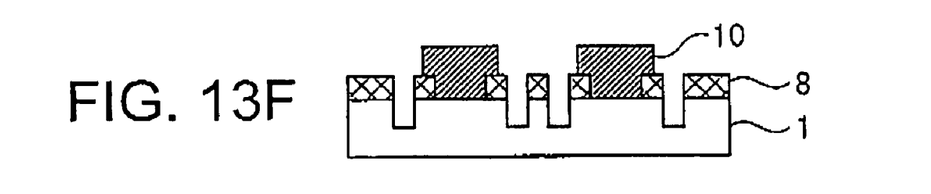
Figure 13G:
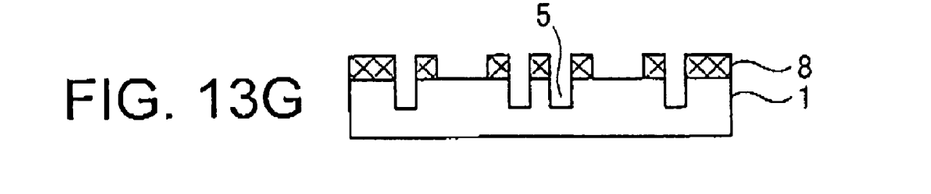

Then, as shown in FIG. 13F, dry etching using a mixed gas of $CHF_3$ and $O_2$ was applied to the transparent substrate 1 using the second resist pattern 10 as a mask, thereby forming etched portions (recesses) 5 each having a thickness of 170 nm in the transparent substrate 1. Thereafter, the remaining second resist pattern 10 was stripped as shown in FIG. 13G.

An auxiliary pattern type phase shift mask manufactured through the foregoing processes was subjected to a defect inspection thereafter, but no defect portion was detected, and further, excellent results were obtained also in transfer.

In each of the foregoing first and second examples, the auxiliary pattern type phase shift mask has been described. However, this invention is not limited thereto, but is applicable to various photomask manufacturing methods each using a light-shielding pattern obtained by first etching as a mask in second etching. For example, it is applicable to any photomask manufacturing method in which portions to be selectively etched can be specified by combination of processes and data processing when forming recesses in a transparent substrate. Further, as described before, it may be a photomask manufacturing method in which a light-semitransmitting layer is formed as an underlying layer below a light-shielding layer and the light-shielding layer is finally removed after forming recesses in a transparent substrate. In this case, the light-semitransmitting layer may be a thin film that does not substantially generate a phase difference.

What is claimed is:

1. A pattern forming method for processing a coating layer over a substrate into a predetermined pattern by partly removing said coating layer and then forming recesses in said substrate below said coating layer at least a part of where said coating layer is removed, said recesses having width incapable of being resolved upon pattern transfer, said pattern forming method comprising the steps of:

processing said coating layer into a coating layer pattern;
forming a resist film on said coating layer pattern;
forming a resist pattern by performing writing on said resist film based on writing data and developing said resist film; and
etching said substrate using said coating layer pattern and said resist pattern as a mask to form said recesses in said substrate,
wherein said performing writing step comprises determining an interval of at least two said recesses being smaller than a predetermined amount, and combining pattern data of said at least two recesses, which being adjacent to each other having a remaining portion of said coating layer therebetween, by filling a gap between said at least two recesses so that said pattern data of at least two recesses is continuous.

2. A pattern forming method according to claim 1 wherein said writing data comprise a pattern data of said recesses being subjected to plus-sizing for an alignment offset.

3. A pattern forming method according to claim 1 wherein said writing data is formed by subjecting the pattern data of said recesses to plus-sizing to make at least two sets of said pattern data of said recesses into one continuous pattern, and further by subjecting the continuous pattern to minus-sizing.

4. A method for manufacturing a phase shift mask comprising steps of:

processing a light-shielding layer formed over a transparent substrate into a light-shielding pattern by partly removing said light-shielding layer;
forming a resist film on said light-shielding pattern;
forming a resist pattern by performing writing on said resist film based on writing data and developing said resist film; and
etching said transparent substrate at least a part of where said light-shielding layer is removed using said light-shielding pattern and said resist pattern as a mask to form recesses in said transparent substrate,
wherein said performing writing step comprises determining an interval of at least two said recesses being smaller than a predetermined amount, and combining pattern data of said at least two recesses, which being adjacent to each other having a remaining portion of said light-shielding layer therebetween, by filling a gap between said at least two recesses so that said pattern data of said at least two recesses is continuous.

5. A method according to claim 4 wherein said mask comprises a main opening which is formed in said coating layer and a plurality of auxiliary openings comprising said recesses located at a peripheral portion of the main opening having width not capable of being resolved in a pattern transferring.

6. A pattern forming method for processing a coating layer over a substrate into a predetermined pattern by partly removing said coating layer and then forming recesses in said substrate below said coating layer at least a part of where said coating layer is removed, said recesses having width incapable of being resolved upon pattern transfer, said pattern forming method comprising the steps of:

processing said coating layer into a coating layer pattern;
forming a resist film on said coating layer pattern;
forming a resist pattern by performing writing on said resist film based on writing data and developing said resist film; and
etching said substrate using said coating layer pattern and said resist pattern as a mask to form said recesses in said substrate,
wherein said performing writing comprises;
plus-sizing of said recesses for an alignment offset to make plus-sized pattern data of said recesses, and
combining said plus-sized pattern data of said recesses so that a pattern of a region surrounded by said recesses is deleted.

7. A method for manufacturing a phase shift mask comprising the steps of:

processing a light-shielding layer formed over a transparent substrate into a light-shielding pattern;
forming a resist film on said light-shielding pattern;
forming a resist pattern by performing writing on said resist film based on writing data and developing said resist film, and
etching said transparent substrate using said light-shielding pattern and said resist pattern as a mask to form recesses in said transparent substrate,
wherein said performing writing comprises;
plus-sizing of said recesses for an alignment offset to make plus-sized pattern data of said recesses, and
combining said plus-sized pattern data of said recesses so that a pattern of a region surrounded by said recesses is deleted.

* * * * *